US012584243B2

(12) United States Patent
Umeta

(10) Patent No.: US 12,584,243 B2
(45) Date of Patent: *\*Mar. 24, 2026*

(54) SiC EPITAXIAL WAFER

(71) Applicant: Resonac Corporation, Tokyo (JP)

(72) Inventor: Yoshikazu Umeta, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/938,549

(22) Filed: Nov. 6, 2024

(65) Prior Publication Data

US 2025/0146174 A1 May 8, 2025

(30) Foreign Application Priority Data

Nov. 7, 2023 (JP) ................................ 2023-190369
Nov. 5, 2024 (JP) ................................ 2024-193951

(51) Int. Cl.
B32B 3/00 (2006.01)
C30B 25/20 (2006.01)
C30B 29/36 (2006.01)

(52) U.S. Cl.
CPC ............... C30B 25/20 (2013.01); B32B 3/00 (2013.01); C30B 29/36 (2013.01)

(58) Field of Classification Search
CPC ...................................................... C30B 29/36
See application file for complete search history.

(56) References Cited

U.S. PATENT DOCUMENTS

| | | | |
|---|---|---|---|
| 10,176,987 B2 | 1/2019 | Miyasaka et al. | |
| 10,801,128 B2 * | 10/2020 | Motoyama | ............ C23C 16/325 |
| 11,326,275 B2 * | 5/2022 | Umeta | .................... C30B 25/14 |
| 2012/0061687 A1 | 3/2012 | Harada et al. | |
| 2019/0187068 A1 | 6/2019 | Guo et al. | |
| 2019/0376206 A1 * | 12/2019 | Fukada | ............. H01L 21/02378 |
| 2020/0066847 A1 * | 2/2020 | Mitani | ................ H01L 21/0262 |
| 2020/0251561 A1 * | 8/2020 | Nishihara | ........... H01L 21/0262 |
| 2022/0173001 A1 | 6/2022 | Ishibashi et al. | |
| 2023/0392288 A1 * | 12/2023 | Yamaguchi | ............. C30B 33/06 |

(Continued)

FOREIGN PATENT DOCUMENTS

| | | |
|---|---|---|
| CN | 109628999 A | 4/2019 |
| JP | 2016-102061 A | 6/2016 |

(Continued)

OTHER PUBLICATIONS

Lei, et al., "A fantastic two-dimensional MoS$_2$ material based on the inert basal planes activation: Electronic structure, synthesis strategies, catalytic active sites, catalytic and electronics properties", Coordination Chemistry Reviews, Sep. 4, 2019, vol. 399, No. 213020, pp. 1-44 (44 pages).

(Continued)

*Primary Examiner* — Elizabeth E Mulvaney
(74) *Attorney, Agent, or Firm* — Sughrue Mion, PLLC

(57) ABSTRACT

An objective of the present invention is to provide a SiC epitaxial wafer with a large diameter, a thin thickness, and few triangular defects. A SiC epitaxial wafer includes a SiC substrate and a SiC epitaxial layer. The SiC substrate has a diameter of 195 mm or more and a thickness of 460 µm or less. The SiC epitaxial layer has a triangular defect density of 0.2 pieces/cm$^2$ or less.

9 Claims, 6 Drawing Sheets

(56) References Cited

U.S. PATENT DOCUMENTS

| 2024/0093405 | A1  | 3/2024  | Tanaka et al. |
| 2025/0059679 | A1* | 2/2025  | Katada ............. H01L 21/02378 |
| 2025/0146175 | A1* | 5/2025  | Umeta ............... H01L 21/0262 |
| 2025/0146178 | A1* | 5/2025  | Umeta ................... C30B 29/64 |
| 2025/0218771 | A1* | 7/2025  | Hisanabe ............... C30B 29/36 |

FOREIGN PATENT DOCUMENTS

| JP | 2017-84989   | A  | 5/2017  |
| JP | 2017-145150  | A  | 8/2017  |
| JP | 2018-107398  | A  | 7/2018  |
| JP | 2018-113303  | A  | 7/2018  |
| JP | 2019-96764   | A  | 6/2019  |
| JP | 6969628      | B2 | 11/2021 |
| KR | 10-2012-0014024 | A | 2/2012 |

OTHER PUBLICATIONS

Communication dated Jul. 15, 2025 from the United States Patent and Trademark Office in U.S. Appl. No. 18/938,677.

* cited by examiner

FIG. 8

SiC EPITAXIAL WAFER

BACKGROUND OF THE INVENTION

Field of the Invention

The present invention relates to a SiC epitaxial wafer.

Priority is claimed on Japanese Patent Application No. 2023-190369, filed Nov. 7, 2023, and Japanese Patent Application No. 2024-193951, filed Nov. 5, 2024, the content of which is incorporated herein by reference.

Description of Related Art

Silicon carbide (SiC) has a dielectric breakdown field that is ten times larger than that of silicon (Si) and has a band gap that is three times larger than that of silicon (Si). Moreover, silicon carbide (SiC) has a characteristic such as thermal conductivity that is three times higher than that of silicon (Si). For this reason, silicon carbide (SiC) is expected to be applied to power devices, high-frequency devices, high-temperature operation devices, and the like. Thus, in recent years, SiC epitaxial wafers have been used for the semiconductor devices as described above.

SiC epitaxial wafers are obtained by stacking a SiC epitaxial layer on the surface of a SiC substrate. Hereinafter, a substrate before the SiC epitaxial layer is stacked will be referred to as a SiC substrate, and a substrate after the SiC epitaxial layer is stacked will be referred to as a SiC epitaxial wafer. The SiC substrate is produced by cutting out the SiC substrate from the SiC ingot. SiC devices such as a power device, a high-frequency device, and a high-temperature operating device are obtained by forming a device on the SiC epitaxial layer of the SiC epitaxial wafer and then chipping the SiC epitaxial wafer.

In SiC epitaxial wafers, a triangular defect is one of the defects that need to be reduced. For example, Patent Document 1 discloses a SiC epitaxial wafer having a triangular-defect-specific areal density of 1.0 $cm^{-2}$ or less.

PATENT DOCUMENTS

[Patent Document 1] Japanese Patent No. 6969628
[Patent Document 2] Japanese Unexamined Patent Application, First Publication No. 2017-84989
[Patent Document 3] Japanese Unexamined Patent Application, First Publication No. 2019-96764

SUMMARY OF THE INVENTION

To increase the number of SiC devices that can be acquired from a single SiC epitaxial wafer, a larger diameter of the SiC epitaxial wafer is required. However, it is not easy to increase the diameter of the SiC epitaxial wafer.

When the SiC epitaxial wafer has a large diameter, the internal stress may increase and the shape may change greatly in the manufacturing process. When a thickness of the SiC substrate increases, a change in the shape of the SiC epitaxial wafer can be suppressed, but an increase in cost and an increase in the resistance of the device are caused. On the other hand, if the thickness is simply reduced, the SiC substrate will move more easily during vacuuming when the SiC epitaxial layer is formed or when the SiC substrate rotates. When the SiC substrate rubs against other components, dust is generated and particles, which is one of the causes of triangular defects, are generated.

The present invention has been made in view of the above-described problems and an objective of the present invention is to provide a SiC epitaxial wafer with a large diameter, a thin thickness, and few triangular defects.

(1) According to a first aspect, there is provided a SiC epitaxial wafer including: a SiC substrate; and a SiC epitaxial layer, wherein the SiC substrate has a diameter of 195 mm or more and a thickness of 460 μm or less, and wherein the SiC epitaxial layer has a triangular defect density of 0.2 pieces/cm² or less.

(2) In the SiC epitaxial wafer according to the above-described aspect, a local thickness variation (LTV) in each of a plurality of unit exposure regions classified as 20 mm squares may be 4 μm or less in a planar view in a stacking direction of the SiC epitaxial wafer.

(3) In the SiC epitaxial wafer according to the above-described aspect, site flatness (site flatness, front reference surface, least-squares best-fit reference plane, range (SFQR)) in each of a plurality of unit exposure regions classified as 20 mm squares may be 2 μm or less in a planar view in a stacking direction of the SiC epitaxial wafer.

(4) In the SiC epitaxial wafer according to the above-described aspect, warp may be 90 μm or less.

(5) In the SiC epitaxial wafer according to the above-described aspect, bow may be 60 μm or less when a surface connecting a support point overlapping a circumference within 7.5 mm from the outermost circumference and an overlapping portion as seen in a thickness direction is used as a reference surface.

(6) In the SiC epitaxial wafer according to the above-described aspect, SORI may be 60 μm or less.

(7) In the SiC epitaxial wafer according to the above-described aspect, the SiC epitaxial layer can be divided into a plurality of regions each having a 5 mm square in a planar view in a stacking direction of the SiC epitaxial wafer, and a proportion of regions not having any triangular defect among the plurality of regions may be 98% or more.

(8) In the SiC epitaxial wafer according to the above-described aspect, the SiC epitaxial layer may have a carrier concentration variation of 20% or less.

(9) In the SiC epitaxial wafer according to the above-described aspect, a variation in a film thickness of the SiC epitaxial layer may be 5% or less.

According to the above-described aspects, a SiC epitaxial wafer has a large diameter, a thin thickness, and few triangular defects.

BRIEF DESCRIPTION OF THE DRAWINGS

FIG. 8 is a diagram showing a unit exposure region.

DETAILED DESCRIPTION OF THE INVENTION

Figures 1, 2:
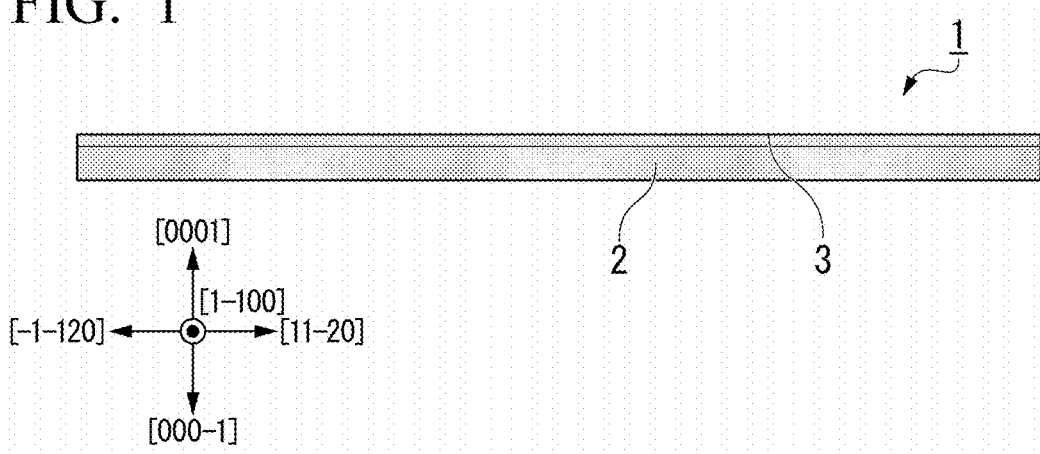
FIG. 1 is a cross-sectional view of a SiC epitaxial wafer according to the present embodiment.
FIG. 2 is a plan view of the SiC epitaxial wafer according to the present embodiment.

Hereinafter, a SiC epitaxial wafer and the like according to the present embodiments will be described in detail with reference to the drawings as appropriate. In the drawings used in the following description, featured parts may be enlarged for convenience such that the features of the present invention are easier to understand, and dimensional ratios and the like of the respective components may be different from actual ones. Materials, dimensions, and the like exemplified in the following description are examples, the present invention is not limited thereto, and modifications can be appropriately made without departing from the subject matter of the present invention.

As used herein, an individual direction is denoted by [ ] and a group direction is denoted by < >. For negative indices, a "-" (bar) placed above the number is customary in crystallography, but a negative sign is placed before the number in this specification.

FIG. 1 is a cross-sectional view of a SiC epitaxial wafer 1 according to the present embodiment. FIG. 2 is a plan view of the SiC epitaxial wafer 1 according to the present embodiment.

The SiC epitaxial wafer 1 includes a SiC substrate 2 and a SiC epitaxial layer 3. A planar shape of the SiC epitaxial wafer 1 is approximately circular. The SiC epitaxial wafer 1 may have a notch 4 for ascertaining a direction of a crystal axis. Moreover, the SiC epitaxial wafer 1 may have an orientation flat instead of the notch 4.

The SiC epitaxial wafer 1 is a wafer of 8 inches or more. A diameter of the SiC epitaxial wafer 1 is 195 mm or more, preferably 199 mm or more. Moreover, the diameter of the SiC epitaxial wafer 1 is preferably 205 mm or less, more preferably 201 mm or less.

The diameter of the SiC epitaxial wafer may be measured using the laser displacement meter.

The SiC substrate 2 is made of, for example, n-type SiC. A polytype of the SiC substrate 2 may be any of 2H, 3C, 4H, or 6H regardless of particular preference. The SiC substrate 2 is, for example, 4H-SiC. A diameter of the SiC substrate 2 is the same as a diameter of the SiC epitaxial wafer 1.

The thickness of the SiC substrate 2 is 460 μm or less, preferably 420 μm or less, more preferably 380 μm or less, more preferably 375 μm or less, more preferably 350 μm or less, more preferably 300 μm or less, more preferably 250 μm or less, more preferably 200 μm or less, more preferably 150 μm or less, more preferably 100 μm or less, and particularly preferably 50 μm or less. The thickness of the SiC substrate 2 may be 1 μm or more. When the thickness of the SiC substrate 2 is thin, the yield of the SiC device that can be obtained from one SiC ingot is high. Moreover, when the thickness of the SiC substrate 2 is thin, it is possible to suppress the high resistance of the SiC device.

The thickness of the SiC substrate may be measured using the laser displacement meter.

The SiC epitaxial layer 3 is stacked on one side of the SiC substrate 2. The SiC epitaxial layer 3 is made of SiC.

In the SiC epitaxial layer 3 according to the present embodiment, a triangular defect density is 0.2 pieces/cm$^2$ or less. A triangular defect density in the SiC epitaxial layer 3 is preferably 0.1 pieces/cm$^2$ or less, more preferably 0.05 pieces/cm$^2$ or less, even more preferably 0.03 pieces/cm$^2$ or less, and particularly preferably 0.01 pieces/cm$^2$ or less.

A lower limit of the triangular defect density in the SiC epitaxial layer 3 may be 0.003 pieces/cm$^2$. The lower limit of the triangular defect density in the SiC epitaxial layer 3 may be 0 pieces/cm$^2$.

It is only necessary to measure the triangular defect density observed in the field of view as the triangular defect density using an optical microscope (a product name of SICA88 manufactured by Lasertec Corporation).

Figure 3:
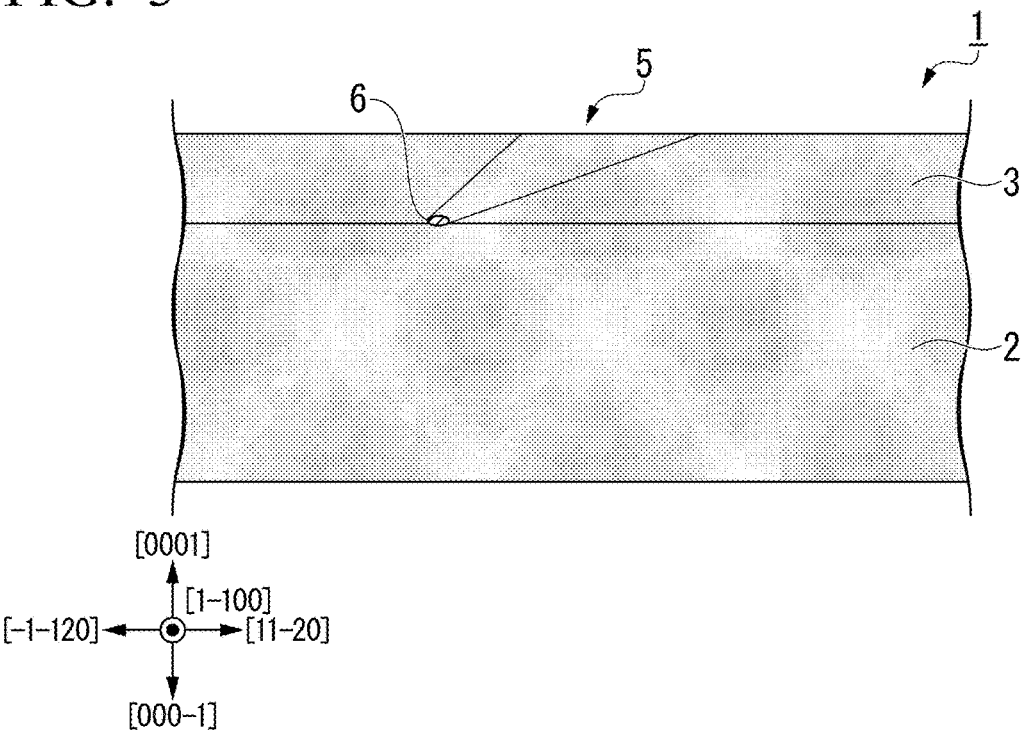
FIG. 3 is a cross-sectional view for describing a triangular defect according to the present embodiment.
Figure 4:
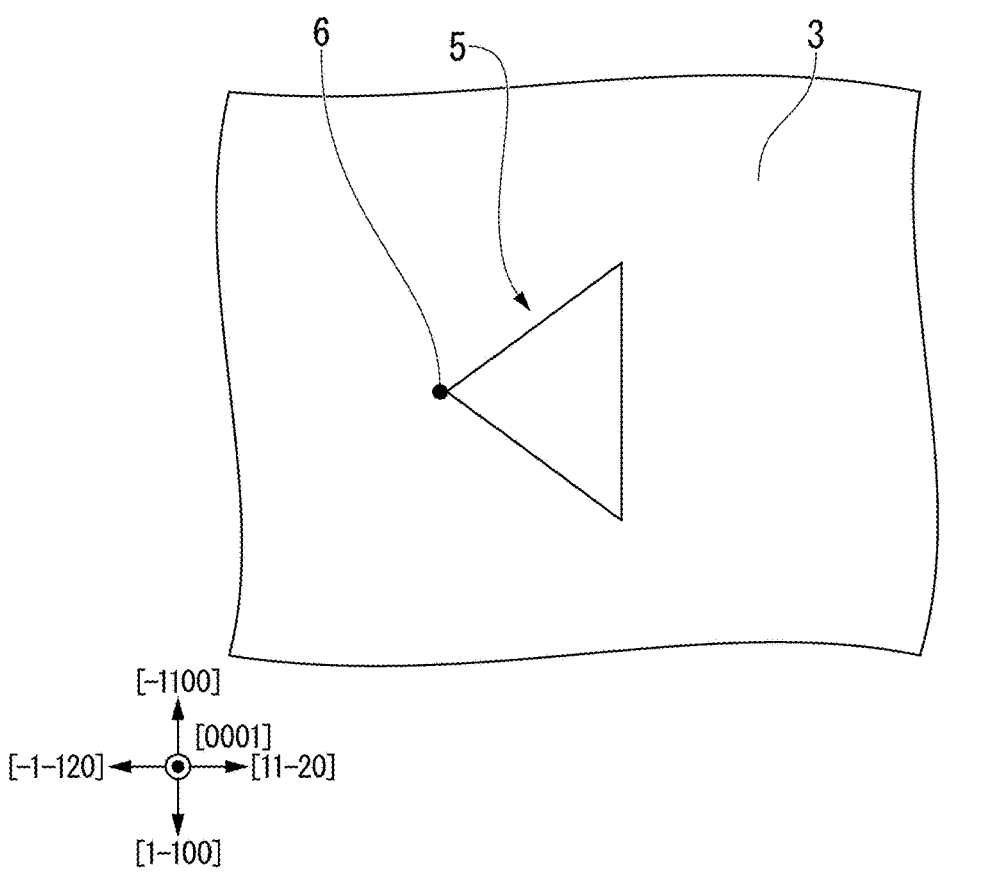
FIG. 4 is a plan view of the triangular defect according to the present embodiment.

The triangular defect is a defect that appears to be triangular when the surface of the SiC epitaxial layer 3 is observed using an optical microscope. FIGS. 3 and 4 are explanatory diagrams showing the triangular defect. A triangular defect 5 extends from a starting point 6 in a step flow growth direction. The triangular defect 5 is formed in a direction in which a vertex of the triangle and its opposite side (a bottom) are arranged in order in the step flow growth direction. The starting point 6 is, for example, a particle, damage such as a scratch on the SiC substrate 2, a two-dimensional nucleus formed on a terrace during step flow growth, a crystal nucleus of a heterogeneous polytype, a penetrating spiral dislocation (TSD), or the like.

The SiC epitaxial layer 3 can be divided into a plurality of regions in a planar view in a stacking direction of the SiC epitaxial wafer (a <0001> direction). Each of the regions includes a square with a side length of a. The region is laid on the surface of the SiC epitaxial layer 3 without any gaps. The center of one of the plurality of regions coincides with the center of the SiC epitaxial layer 3. Each region corresponds to an individual chip and each region is a SiC device.

For example, when the SiC epitaxial layer 3 is divided into a plurality of regions A each having a side length of 5 mm, the proportion of the region that does not have the triangular defect 5 is preferably 98% or more. In this case, an upper limit of the proportion of the region that does not have the triangular defect 5 may be 99% or 100%. The upper limit of the proportion of the region that does not have the triangular defect 5 may be 99.97%.

For example, when the SiC epitaxial layer 3 is divided into a plurality of regions having a side length of 7 mm, the proportion of the region that does not have the triangular defect 5 is preferably 95% or more and more preferably 98% or more. In this case, an upper limit of the proportion of the region that does not have the triangular defect 5 may be 99% or 100%. The upper limit of the proportion of the region that does not have the triangular defect 5 may be 99.97%.

For example, when the SiC epitaxial layer 3 is divided into a plurality of regions having a side length of 10 mm, the proportion of the region that does not have the triangular defect 5 is preferably 88% or more, more preferably 95% or more, and even more preferably 98% or more. In this case, an upper limit of the proportion of the region that does not have the triangular defect 5 may be 99% or 100%. The upper limit of the proportion of the region that does not have the triangular defect 5 may be 99.97%.

For example, when the SiC epitaxial layer 3 is divided into a plurality of regions having a side length of 15 mm, the proportion of the region that does not have the triangular defect 5 is preferably 75% or more, more preferably 88% or more, even more preferably 95% or more, and particularly preferably 98% or more. In this case, an upper limit of the proportion of the region that does not have the triangular defect 5 may be 99% or 100%. The upper limit of the proportion of the region that does not have the triangular defect 5 may be 99.97%.

For example, when the SiC epitaxial layer 3 is divided into a plurality of regions having a side length of 20 mm, the proportion of the region that does not have the triangular defect 5 is preferably 60% or more, more preferably 75% or more, even more preferably 88% or more, more preferably 95% or more, and still more preferably 98% or more. In this case, an upper limit of the proportion of the region that does not have the triangular defect 5 may be 99% or 100%. The upper limit of the proportion of the region that does not have the triangular defect 5 may be 99.97%.

The proportion of the region that does not have the triangular defect 5 in the SiC epitaxial layer 3 may be calculated by a general formula (1): the proportion of the region that does not have the triangular defect={1−(a number of square regions A that has the triangular defect/a total number of square regions A)}×100. In the general formula (1), the total number of square regions A may be obtained by dividing the entire plane of the SiC epitaxial layer 3 into a plurality of non-overlapping square regions A in which a side length a is a specific value, aligned without gaps, using an optical microscope (a product name of SICA88 manu-factured by Lasertec Corporation) and counting the number of the square regions A. The number of square regions A that has the triangular defect may be obtained by counting the number of square regions A that has the triangular defect in the entire plane of the SiC epitaxial layer 3 using the optical microscope.

If the density of triangular defects 5 in the SiC epitaxial layer 3 is 0.2 pieces/cm$^2$ or less, a sufficient proportion of the region that does not have the triangular defect 5 can be achieved. Because the plurality of regions correspond to chips serving as devices, if the above-described proportion is satisfied, SiC devices can be acquired at a high yield from the SiC epitaxial wafer 1 according to the present embodi-ment. Moreover, as the side length increases, a SiC device that can withstand the application of a large electric current can be acquired.

Moreover, in the SiC epitaxial layer according to the present embodiment, a variation in the carrier concentration is preferably 20% or less, more preferably 15% or less, even more preferably 12% or less, still more preferably 10% or less, particularly preferably 5% or less, and particularly more preferably 2% or less. The variation in the carrier concentration is obtained by dividing a difference between a maximum value and a minimum value of the carrier con-centration of the SiC epitaxial layer 3 measured along a straight line extending in a <11-20> direction through the center of the SiC epitaxial layer 3 by a value obtained by multiplying the average value by 2. The carrier concentra-tion may be measured at equal intervals from the center on a straight line or the interval may change. The carrier concentration may be measured at 10 mm intervals, 15 mm intervals, 20 mm intervals, 25 mm intervals, or 30 mm intervals.

A lower limit value of the variation in the carrier con-centration in the SiC epitaxial layer may be 0.5% or 1.5%.

For example, when the diameter of the SiC epitaxial wafer 1 is 200 mm (8 inches), the carrier concentration is measured at the center and positions of ±20 mm, ±40 mm, ±60 mm, ±80 mm, and ±95 mm from the center along a straight line extending in the <11-20> direction with the center as the reference. Carrier concentration uniformity is obtained from carrier concentrations at these measurement points.

Moreover, for example, when the diameter of the SiC epitaxial wafer 1 is 250 mm (10 inches), the carrier con-centration is measured at the center and positions of ±25 mm, ±50 mm, ±75 mm, ±100 mm, and ±120 mm from the center along the straight line extending in the <11-20> direction with the center as the reference. Carrier concen-tration uniformity is obtained from carrier concentrations at these measurement points.

Moreover, for example, when the diameter of the SiC epitaxial wafer 1 is 300 mm (12 inches), the carrier con-centration is measured at the center and positions of ±30 mm, ±60 mm, ±90 mm, ±120 mm, and ±145 mm from the center along the straight line extending in the <11-20> direction with the center as the reference. Carrier concen-tration uniformity is obtained from carrier concentrations at these measurement points.

Here, the carrier concentration is an effective carrier concentration. The effective carrier concentration is an abso-lute value of a difference between a donor concentration and an acceptor concentration. The carrier concentration of the SiC epitaxial layer 3 can be measured by, for example, a mercury probe (Hg-CV) method or a secondary ion mass spectrometry (SIMS) method. In the Hg-CV method, a difference between the donor concentration and the acceptor concentration is measured as the effective carrier concen-tration. The secondary ion mass spectrometry (SIMS) method is a method of performing ejected secondary ion mass spectrometry while scraping the layer in a thickness direction. Doping concentrations can be measured from mass spectrometry. In the secondary ion mass spectrometry (SIMS) method, it is possible to measure actual values of the donor concentration and the acceptor concentration and find the effective carrier concentration by finding a difference therebetween.

In the first region at a distance of 60 mm or more and 95 mm or less from the center in the planar view in the stacking direction of the SiC epitaxial wafer, the variation in the carrier concentration of the SiC epitaxial layer 3 is prefer-ably 20% or less, more preferably 15% or less, even more preferably 12% or less, still more preferably 10% or less, particularly preferably 5% or less, and particularly more preferably 2% or less. The first region is located on an outer peripheral side of the SiC epitaxial wafer 1 and is a portion where the carrier concentration is likely to vary. If the variation in the portion is within the above-described range, the element variation of the SiC device after a device generation process can be further reduced. The carrier concentration in the first region, for example, is measured at points of ±60 mm, ±80 mm, and ±95 mm from the center along the straight line extending in the <11-20> direction with the center C as the reference and measured at points of ±60 mm, ±80 mm, ±95 mm, and −90 mm from the center along the straight line extending in a <−1100> direction with the center C as the reference. A point of −90 mm is arranged on the inside to avoid the notch 4. In addition, the [11-20] direction or the [−1100] direction is denoted by "+."

A lower limit value of the variation in the carrier con-centration in the first region may be 0.5% or 1.5%.

Moreover, in the SiC epitaxial layer 3 according to the present embodiment, a variation in the film thickness may be 5% or less. The variation in the film thickness of the SiC epitaxial layer 3 is preferably 4% or less, more preferably 3% or less, even more preferably 2% or less, and particularly preferably 1% or less. The variation in the film thickness is obtained by dividing a difference between a maximum value and a minimum value of the film thickness of the SiC epitaxial layer 3 measured using the infrared spectrometric method along a straight line extending in the <11-20> direction through the center of the SiC epitaxial layer 3 by a value obtained by multiplying the average value by 2. The measurement point of the film thickness is similar to the measurement point of the carrier concentration.

A lower limit value of the variation in the film thickness of the SiC epitaxial layer 3 may be 0.3% or 0.9%.

In the first region at a distance of 60 mm or more and 95 mm or less from the center in the planar view in the stacking direction of the SiC epitaxial wafer, the variation in the film thickness of the SiC epitaxial layer 3 is preferably 5% or less, more preferably 4% or less, even more preferably 3% or less, still more preferably 2% or less, and particularly preferably 1% or less. The first region is located on an outer peripheral side of the SiC epitaxial wafer 1 and is a portion where the film thickness is likely to vary. If a variation in the portion is within the above-described range, a variation in the element of the SiC device after a device generation process can be further reduced. A measurement point of the film thickness is similar to a measurement point of the carrier concentration.

In the first region, the lower limit value of the variation in the film thickness of the SiC epitaxial layer 3 may be 0.3% or 0.9%.

Moreover, the SiC epitaxial wafer 1 according to the present embodiment has preferably a warp of 90 μm or less, more preferably a warp of 75 μm or less, and even more preferably 50 μm or less, and particularly preferably 30 μm or less. Additionally, the warp may be 30 μm or less, may be 20 μm or less, may be 15 μm or less, may be 10 m or less, and may be 5 μm or less. The SiC epitaxial wafer 1 with a warp of 90 μm or less is advantageous in terms of conveyance to a process device and alignment accuracy.

A lower limit value of the warp may be 0 μm or 1.0 μm.

Figure 5:
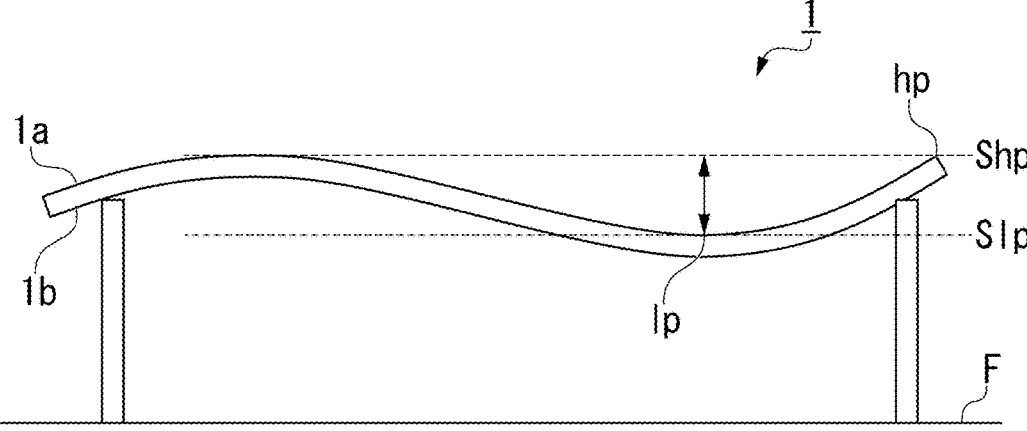
FIG. 5 is a diagram schematically showing a method of evaluating a shape of the SiC epitaxial wafer by warp.

FIG. 5 is a diagram schematically showing a method for evaluating the shape (deformation) of a SiC substrate by warp. The warp is a distance in a thickness direction between a highest point hp and a lowest point 1p of the first surface 1a. The first surface 1a is an outer surface of the SiC epitaxial layer 3. It is determined that the SiC epitaxial wafer 1 is deformed as the warp increases.

First, the SiC epitaxial wafer 1 is installed on three support points installed on the flat surface F. The support point is, for example, at a position overlapping a circumference within 7.5 mm from an outer peripheral end of the SiC epitaxial wafer 1. A virtual plane Slp parallel to the flat surface F through the lowest point 1p in the first surface 1a and a virtual plane Shp parallel to the flat surface F through the highest point hp in the first surface 1a are obtained. The warp is obtained as the distance in the height direction between the virtual plane Slp and the virtual plane Shp. The height direction is orthogonal to the flat surface F and is a direction away from the flat surface F.

In the SiC epitaxial wafer 1 according to the present embodiment, an absolute value of the bow is preferably 60 μm or less, and more preferably 45 μm or less. Additionally, the absolute value of the bow may be 30 μm or less, may be 20 μm or less, may be 15 μm or less, may be 10 μm or less, and may be 5 μm or less. The SiC epitaxial wafer 1 in which an absolute value of the bow is 60 μm or less can be properly focused on a processed surface even in fine lithography processes, and the SiC epitaxial wafer 1 can be processed with high precision.

A lower limit value of the bow may be 0.5 μm as the absolute value.

Figure 6:
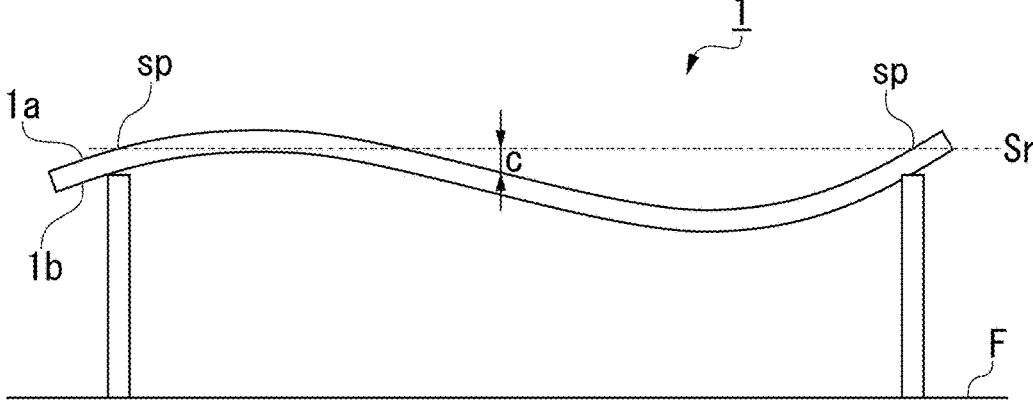
FIG. 6 is a diagram schematically showing a method of evaluating the shape of the SiC epitaxial wafer by bow.

FIG. 6 is a diagram schematically showing a method of evaluating the shape (deformation) of the SiC epitaxial wafer 1 by bow. The bow is a position of a center c of the SiC epitaxial wafer 1 in the height direction with respect to the reference plane Sr. In other words, the bow is a signed distance of the center c of the SiC epitaxial wafer 1 from the reference plane Sr. The reference plane Sr is a surface connecting points sp overlapping the three support points as seen in the thickness direction within the first surface 1a. The three support points are located at positions overlapping, for example, the circumference within 7.5 mm from the outer peripheral end of the SiC epitaxial wafer 1. Each of the three support points is at a three-fold symmetrical position with the center of the SiC epitaxial wafer 1 supported by the support point on the central axis. The reference plane Sr is, for example, a three-point reference plane. It is determined that the SiC epitaxial wafer 1 is deformed as the absolute value of the bow increases.

First, the SiC epitaxial wafer 1 is installed on three support points installed on the flat surface F. The three points sp of the first surface 1a located on the support point as seen from the thickness direction are connected and the reference plane Sr is obtained. Also, the reference plane Sr is set to 0, a direction away from the flat surface F with the reference plane Sr as the reference is defined as +, and a direction close to the flat surface F with the reference plane Sr as the reference is defined as −. The bow is obtained as a position in the height direction with respect to the reference plane Sr of the center c of the first surface 1a. In other words, the bow is obtained as a signed distance of the center c of the first surface 1a from the reference plane Sr.

In the SiC epitaxial wafer 1 according to the present embodiment, the SORI is preferably 60 μm or less, and more preferably 45 μm or less. Additionally, the SORI may be 30 μm or less, may be 25 μm or less, may be 20 μm or less, may be 10 μm or less, and may be 5 μm or less.

A lower limit value of the SORI may be 0 μm or 0.5 μm.

Figure 7:
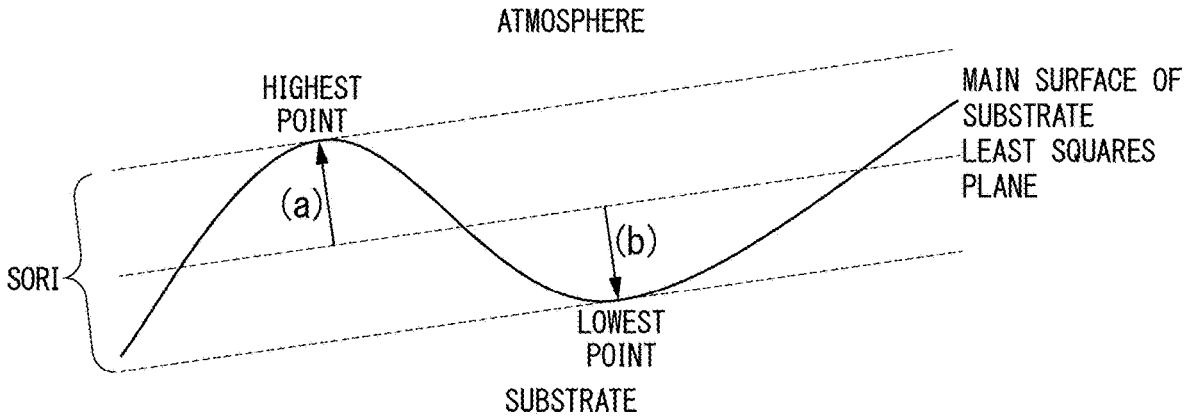
FIG. 7 is a conceptual diagram showing the definition of a SORI.

The SORI is one parameter indicating a degree of warpage of the substrate and is expressed as a sum of normal distances from a least squares plane, calculated by the least squares method using all data on the substrate surface, to the highest and lowest points on the substrate surface when measurement has been performed so that the back surface of the substrate is supported and the original shape does not change. As shown in FIG. 7, when the least squares plane of the substrate surface is the reference height (the least squares plane height), a sum ((a)+(b)) of a distance (a) between the height at the highest point of the substrate surface and the reference height and a distance (b) between the height at the lowest point of the substrate surface and the reference height is expressed. Here, all data on the substrate surface is all data related to a relative height of the surface of the SiC epitaxial wafer from the reference plane obtained using the interference fringe image of the laser light.

In the SiC epitaxial wafer 1 according to the present embodiment, a local thickness variation (LTV) in each of the plurality of unit exposure regions classified as 20 mm squares is preferably 4 μm or less, more preferably 3 μm or less, and even more preferably 2.5 μm or less. When the conditions are satisfied, the focus can be appropriately adjusted to the processed surface even in the fine lithography process, and the SiC epitaxial wafer 1 can be processed with high accuracy.

A lower limit value of the local thickness variation (LTV) may be 0.1 μm.

Figure 8:
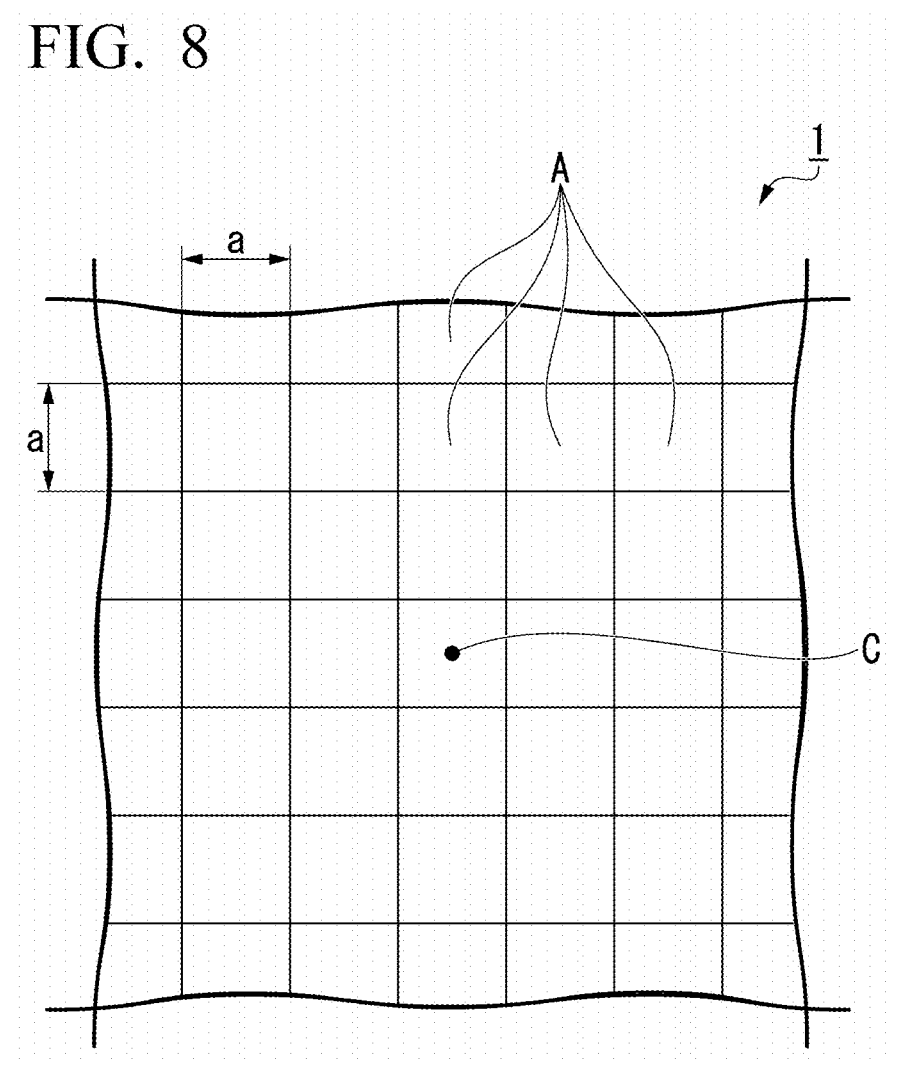

FIG. 8 is a diagram showing a unit exposure region A. The unit exposure region A is each of a plurality of regions classified as squares having a side length a in the planar view in the stacking direction of the SiC epitaxial wafer (a <0001> direction). The unit exposure regions A are laid on the surface of the SiC epitaxial wafer 1 without any gaps. The center of one of the plurality of unit exposure regions A coincides with the center C of the SiC epitaxial wafer 1. For example, in the measurement of the LTV, the side length a of the unit exposure region A is set to 20 mm. The LTV, which is a distance difference between the highest point and the lowest point, is obtained by measuring the highest point and the lowest point in the site surrounded by the unit exposure regions A when the SiC epitaxial wafer 1 is adsorbed on a vacuum chuck.

In the SiC epitaxial wafer 1 according to the present embodiment, a site flatness (SFQR) in each of the plurality of unit exposure regions classified as 20 mm squares is preferably 2 μm or less, more preferably 1.5 μm or less, and even more preferably 1 μm or less.

A lower limit value of site flatness (SFQR) may be 0 μm or 0.05 μm.

The SFQR is expressed as a sum of normal distances from a least squares plane, calculated by the least squares method using all data in the site surrounded by the unit exposure regions A when the SiC epitaxial wafer 1 is adsorbed on a vacuum chuck, to the highest and lowest points on the substrate surface. The SFQR is different from the SORI in that it is a measurement result at a specific site. For example, in the measurement of the SFQR, the side length a of the unit exposure region A is 20 mm. Here, all data of the site surrounded by the unit exposure regions A is all data related to a relative height of the surface of the SiC epitaxial wafer 1 from the reference plane.

Next, a method of manufacturing the SiC epitaxial wafer 1 according to the present embodiment will be described.

Figure 9:
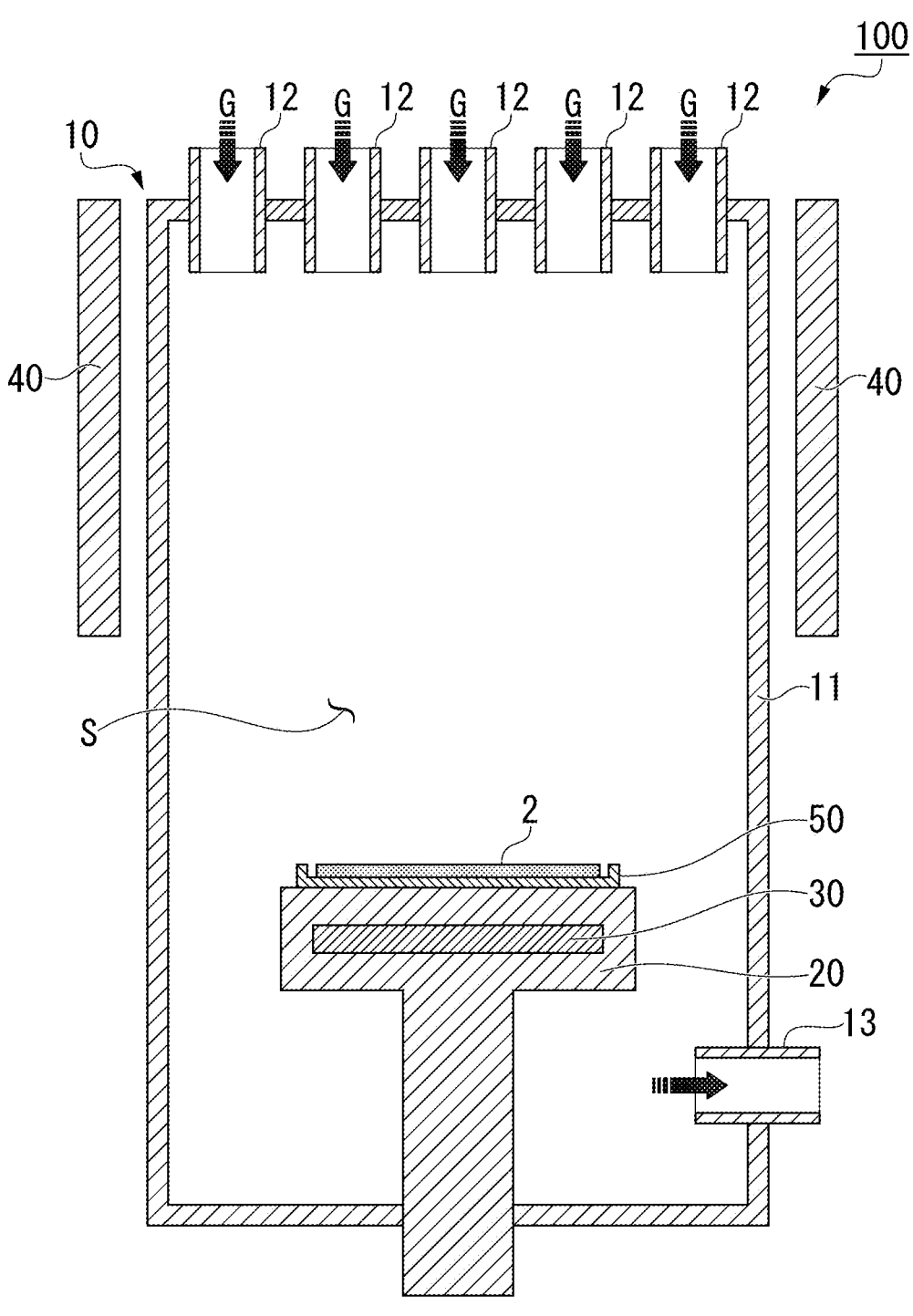
FIG. 9 is a cross-sectional view of a manufacturing device for the SiC epitaxial wafers according to the present embodiment.

FIG. 9 is a cross-sectional schematic diagram of an example of a film formation device for a SiC epitaxial wafer according to the present embodiment. The film formation device 100 includes, for example, a chamber 10, a support 20, a lower heater 30, and an upper heater 40. The SiC substrate 2 is placed on a susceptor 50 and transported into a film formation device 100.

The support 20 supports the susceptor 50. The support 20, for example, can be rotated about an axis. The SiC substrate 2 is arranged on the support 20, for example, in a state in which the SiC substrate 2 is placed on the susceptor 50. The lower heater 30, for example, is in the support 20 and heats the SiC substrate 2. The upper heater 40 heats the upper part of the chamber 10.

The chamber 10 includes, for example, a main body 11, a gas supply port 12, and a gas exhaust port 13. The main body 11 surrounds a film formation space S. The gas supply port 12 is an inlet for supplying gas G to the film formation space S. The plurality of gas supply ports 12, for example, are located above a placement surface of the SiC substrate 2. The film formation device in which the gas supply port 12 is located above the placement surface of the SiC substrate 2 is referred to as a vertical furnace. The gas exhaust port 13 is an outlet for exhausting gas G or the like accumulated in the film formation space S. The gas exhaust port 13, for example, is located below the placement surface of the SiC substrate 2.

The gas G is, for example, a source gas, a carrier gas, a dopant gas, and an etching gas. The source gas includes a Si-based source gas and a C-based source gas.

The Si-based source gas is a source gas containing Si in the molecule. Examples of the Si-based source gas include silane ($SiH_4$), dichlorosilane ($SiH_2Cl_2$), trichlorosilane ($SiHCl_3$), tetrachlorosilane ($SiCl_4$), and the like. The Si-based source gas preferably includes at least one selected from the group consisting of, for example, $SiH_3Cl$, $SiH_2Cl_2$, and $SiHCl_3$.

The C-based source gas is a source gas containing C in the molecule. Examples of the C-based source gas are propane ($C_3H_8$) and ethylene ($C_2H_4$). The C-based source gas preferably includes, for example, at least one selected from the group consisting of $CH_4$, $C_2H_6$, and $C_3H_8$.

A dopant gas is a gas containing a carrier element. The dopant gas preferably contains, for example, at least one of nitrogen ($N_2$) and ammonia ($NH_3$).

The carrier gas is a gas that conveys the source gas to the SiC substrate 2, and is a gas that is inert to SiC. The carrier gas preferably contains, for example, Ar.

An etching gas is a gas that reacts with SiC at a high temperature and has the action of etching SiC. The etching gas is preferably, for example, hydrogen chloride (HCl).

Figure 10:
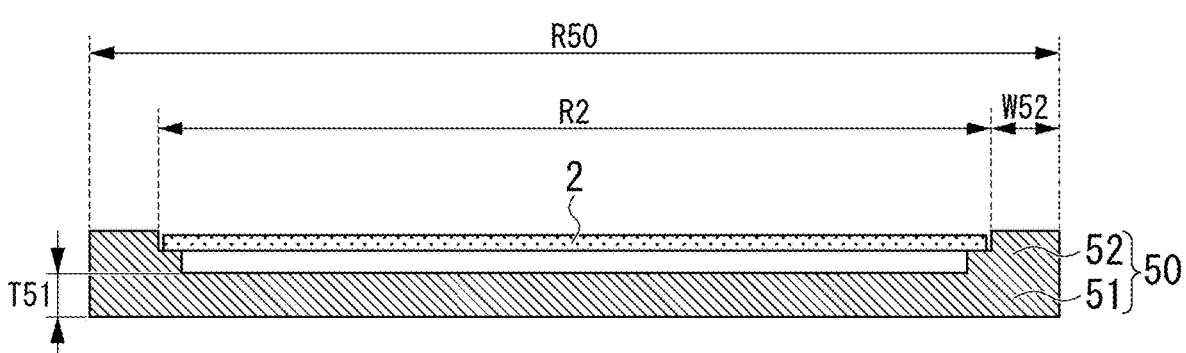
FIG. 10 is a cross-sectional view of a state in which a SiC substrate is placed on a susceptor.

The susceptor 50 supports the SiC substrate 2. FIG. 10 is a cross-sectional view of a state in which the SiC substrate 2 is placed on the susceptor 50. The susceptor 50 has a main body 51 and a frame 52 protruding from the main body 51. The frame 52 prevents the SiC substrate 2 rotating during film formation from popping outward.

A diameter R50 of the susceptor 50 is preferably 102.5% or more and 115% or less of the diameter R2 of the SiC substrate 2. By making the size of the susceptor 50 close to the size of the SiC substrate 2, the susceptor 50 is bent along the SiC substrate 2 bent during epitaxial growth. When the SiC substrate 2 is bent, the distance between the SiC substrate 2 and the susceptor 50 is not significantly changed, so that the uniformity of the carrier concentration of the SiC epitaxial layer 3 formed on the SiC substrate 2 can be increased.

A thickness T51 of the main body 51 of the susceptor 50 is preferably 1 mm or more and 4 mm or less. The main body 51 is a portion facing the SiC substrate 2. The thickness T51 of the main body 51 has a significant influence on the curvature of the susceptor 50. Because the thickness T51 of the main body 51 is thin, when the SiC substrate 2 is bent, the susceptor 50 can be bent following the SiC substrate 2.

Moreover, a radial width W52 of the frame 52 of the susceptor 50 is, for example, 10 mm or less. By narrowing the width W52, the entire susceptor 50 is more likely to be bent.

In the film formation step, the SiC substrate 2 placed on the susceptor 50 is arranged inside the chamber 10. A distance between the inner surface of the chamber 10 and the SiC substrate 2 is set to 100 mm or more and 800 mm or less. By securing a distance between the inner surface of the chamber 10 and the SiC substrate 2, the generation of the triangular defect 5 caused by particles from the chamber 10 can be suppressed. Moreover, a distance between the inner surface of the chamber 10 and the SiC substrate 2 is secured, and therefore a gas that is not a source gas, such as hydrogen or argon, can easily flow outside of a source gas supply unit (near the inner surface of the chamber 10). When a gas that is not a source gas of 5% or more of a total amount of gas introduced into the chamber 10 flows near the inner surface of the chamber 10, it is possible to suppress the adhesion of the source gas to an inner wall of the chamber 10. The source gas adhering to the inner wall generates a particle-like by-product and can cause the occurrence of the triangular defect 5. Moreover, a distance between the inner surface of the chamber 10 and the SiC substrate 2 is less than or equal to a certain distance, and therefore the input source gas can be efficiently supplied to the SiC substrate 2, and the consumption of the source gas per film thickness can be suppressed. As a result, costs related to the epitaxial growth can be reduced.

Also, the inside of the chamber 10 is vacuumed. Vacuuming is performed at a low speed, and the rate of vacuuming is 5 kPa/sec or less. By vacuuming at a low speed, it is possible to suppress the movement of the thin SiC substrate 2 during vacuuming. When the SiC substrate 2 moves during vacuuming, the SiC substrate 2 rubs against the surrounding parts and causes dust generation.

Also, the SiC epitaxial layer 3 is formed on the SiC substrate 2. The SiC epitaxial layer 3 is formed during the rotation of the SiC substrate 2. The rotational speed of the SiC substrate 2 is set to 200 rpm or less. If the rotational speed of the SiC substrate 2 is excessively fast, the SiC substrate 2 rubs against the surrounding components due to a centrifugal force. By suppressing the rotational speed of the SiC substrate 2 during film formation, the generation of particles during film formation can be suppressed.

The SiC epitaxial layer 3 is formed by supplying a mixed gas including a Si-based source gas, a C-based source gas, an etching gas, a carrier gas, and a dopant gas to one surface of the SiC substrate 2. When these mixed gases are supplied, it is preferable that a carrier gas with a heavy molecular weight be locally unevenly distributed and exhausted from some gas supply ports 12 among the plurality of gas supply ports 12. Hereinafter, the gas supply port 12 from which the carrier gas with the heavy molecular weight is exhausted is referred to as a first gas supply port.

A carrier gas with a heavy molecular weight is a gas with a molecular weight of 28 or more, and is, for example, Ar. A process of locally unevenly distributing and exhausting a gas with a heavy molecular weight is implemented by combining first gas supply ports among the plurality of gas supply ports 12 within a certain range. The first gas supply ports among the plurality of gas supply ports 12 are arranged in the central portion.

An area of a portion to which the first gas supply ports belong is preferably 0.3% or more and 2.5% or less of an area of a top plate of the chamber 10. The area of the portion to which the first gas supply ports belong is an area surrounded by a line connecting first gas supply ports located at outermost positions. Moreover, a total supply port area of the first gas supply ports is preferably 10% or more and 30% or less of a total supply port area of the plurality of gas supply ports 12.

A flow rate of a gas with a heavy molecular weight supplied from the first gas supply port is preferably 1000 sccm or more and 4000 sccm or less.

When a carrier gas with a heavy molecular weight is unevenly distributed and supplied at a predetermined flow rate, a gas G is convected in the film formation space S. Although the gas G passes from the gas supply port 12 to the surface of the SiC substrate 2 and forms a flow toward the gas exhaust port 13 in general, a variation in a carrier concentration of the SiC epitaxial layer 3 can be suppressed by deliberately allowing the gas G to convect. Moreover, it is possible to suppress the variation in the film thickness of the SiC epitaxial layer 3 by convection of the gas G.

As described above, by suppressing the rubbing of the SiC substrate 2 with other components during rotation during vacuuming or film formation, the occurrence of triangular defects can be suppressed even if the SiC epitaxial layer 3 is formed on the SiC substrate 2 having a large diameter and a thin thickness. As a result, if the method of manufacturing the SiC epitaxial wafer 1 according to the present embodiment is used, the SiC epitaxial wafer 1 having a large diameter, having a thin thickness, and having few triangular defects can be obtained.

The SiC epitaxial wafer 1 according to the present embodiment has a thin thickness and few triangular defects in the plane despite the large diameter. Therefore, the SiC epitaxial wafer 1 according to the present embodiment has a high yield of a SiC device. Moreover, the SiC device produced from the SiC epitaxial wafer 1 according to the present embodiment has low resistance and low loss during operation.

Although modes for carrying out the present invention have been described using embodiments, the present invention is not limited to the embodiments and various modifications and substitutions can also be made without departing from the scope and spirit of the present invention.

INVENTIVE EXAMPLE

Inventive Example 1

First, a 4H-SiC substrate having a diameter of 200 mm and a thickness of 363 m was provided and housed inside a vertical furnace as shown in FIG. 9. The SiC substrate 2 was placed on the susceptor 50 and housed in the chamber 10 together with the susceptor 50. In the susceptor 50, a diameter was 230 mm, a thickness of the main body was 3 mm, and a radial width of the frame was 10 mm. Also, the inside of the chamber 11 was vacuumed. A vacuuming speed was 3 kPa/sec.

Next, a SiC epitaxial layer 3 having a thickness of 11 μm was formed on the SiC substrate 2. The rotational speed of the SiC substrate 2 during the formation of the SiC epitaxial layer 3 was 100 rpm. The carrier gas was Ar.

A ratio of the area of the part belonging to the carrier gas supply port (first gas supply port) to the top plate of the chamber: 2%

A ratio of the area of the carrier gas supply ports (the first gas supply ports) to all gas supply ports: 20%

A flow rate of the carrier gas was 1000 sccm or more and 4000 sccm or less.

The triangular defect density, the variation in the carrier concentration, and the variation in film thickness in the SiC epitaxial wafer of inventive example 1 produced under the above-described conditions were measured.

The carrier concentration was measured using the Hg-CV method. The measurement points were a center and positions of ±20 mm, ±40 mm, ±60 mm, ±80 mm, and ±95 mm from the center along the straight line extending in the <11-20> direction with the center as the reference. The variation in the carrier concentration was found from the carrier concentration at each measurement point. Moreover, the variation in the carrier concentration in the first region was also measured. The carrier concentration of the first region was measured at points of ±60 mm, ±80 mm, and ±95 mm from the center along a straight line extending in the <11-20> direction with the center C as the reference and points of ±60 mm, ±80 mm, ±95 nm, and −90 mm from the center along a straight line extending in the <−1100> direction with the center C as the reference.

The triangular defect density was measured using an optical microscope (a product name of SICA88 manufactured by Lasertec Corporation).

The proportion of the region that does not have the triangular defect in the SiC epitaxial layer was calculated by the general formula (1): the proportion of the region that does not have the triangular defect={1−(a number of square regions A that has the triangular defect/a total number of square regions A)}×100. In the general formula (1), the total number of square regions A was obtained by dividing the entire plane of the SiC epitaxial layer into the plurality of non-overlapping square regions A in which the side length a is 5 mm, aligned without gaps, using the optical microscope (a product name of SICA88 manufactured by Lasertec Corporation) and counting the number of the square regions A. The number of square regions A that has the triangular defect was obtained by counting the number of square regions A that has the triangular defect in the entire plane of the SiC epitaxial layer 3 using the optical microscope.

The variation in the film thickness was measured by infrared spectroscopy. The variation in the film thickness was also measured in the first region. The measurement point of the variation in the film thickness was the same as the measurement point of the carrier concentration.

The triangular defect density of the SiC epitaxial wafer of inventive example 1 was 0.10 pieces/cm$^2$. Moreover, the variation in the carrier concentration of the SiC epitaxial wafer of inventive example 1 was 5.0%. Moreover, the variation in the carrier concentration in the first region of the SiC epitaxial wafer of inventive example 1 was 5.1%. Moreover, the variation in the film thickness of the SiC epitaxial layer of the SiC epitaxial wafer of inventive example 1 was 2.6%. Moreover, the variation in the film thickness of the epitaxial layer in the first region of the SiC epitaxial wafer of inventive example 1 was 1.9%. Moreover, when the SiC epitaxial layer was divided into a plurality of regions each having a side length of 5 mm, the proportion of the region without triangular defects was 98% or more.

Inventive Example 2

First, a 4H-SiC substrate having a diameter of 200 mm and a thickness of 374 m was provided and housed inside a vertical furnace as shown in FIG. 9. The SiC substrate 2 was placed on the susceptor 50 and housed in the chamber 10 together with the susceptor 50. In the susceptor 50, a diameter was 230 mm, a thickness of the main body was 3 mm, and a radial width of the frame was 10 mm. Also, the inside of the chamber 11 was vacuumed. A vacuuming speed was 3 kPa/sec.

Next, a SiC epitaxial layer 3 having a thickness of 11 μm was formed on the SiC substrate 2. The rotational speed of the SiC substrate 2 during the formation of the SiC epitaxial layer 3 was 100 rpm. The carrier gas was Ar.

A ratio of the area of the part belonging to the carrier gas supply port (first gas supply port) to the top plate of the chamber: 1.5%

A ratio of the area of the carrier gas supply ports (the first gas supply ports) to all gas supply ports: 20%

A flow rate of the carrier gas was 1000 sccm or more and 4000 sccm or less.

In the SiC epitaxial wafer of the SiC epitaxial wafer of inventive example 2 produced under the above conditions, the variation in the carrier concentration and the variation in film thickness were measured in the same manner as in Inventive example 1. Furthermore, the variation in the carrier concentration in the first region and the variation in the film thickness in the first region were measured in the same manner as in Inventive example 1.

The LTV of the SiC epitaxial wafer, the SFQR of the SiC epitaxial wafer, the SORI of the SiC epitaxial wafer, the warp of the SiC epitaxial wafer, and the bow of the SiC epitaxial wafer were obtained by using Ultrasort II manufactured by Corning Tropel.

The triangular defect density of the SiC epitaxial wafer of inventive example 2 was 0.12 pieces/cm$^2$. Moreover, the variation in the carrier concentration of the SiC epitaxial wafer of inventive example 2 was 68.7%. Moreover, the variation in the carrier concentration in the first region of the SiC epitaxial wafer of inventive example 2 was 51.5%. Moreover, the variation in the film thickness of the SiC epitaxial layer of the SiC epitaxial wafer of inventive example 2 was 8.1%. Moreover, the variation in the film thickness of the epitaxial layer in the first region of the SiC epitaxial wafer of inventive example 2 was 6.9%. Moreover, when the SiC epitaxial layer was divided into a plurality of regions each having a side length of 5 mm, the proportion of the region without triangular defects was 98% or more.

The LTV of the SiC epitaxial wafer of inventive example 2 was 3.9 μm. The SFQR of the SiC epitaxial wafer of inventive example 2 was 4.1 μm. The SORI of the SiC epitaxial wafer of inventive example 2 was 37.3 μm. The warp of the SiC epitaxial wafer of inventive example 2 was 48.8 μm. The bow of the SiC epitaxial wafer of inventive example 2 was −16.2 μm.

Inventive Example 3

First, a 4H-SiC substrate having a diameter of 200 mm and a thickness of 377 m was provided and housed inside a vertical furnace as shown in FIG. 9. The SiC substrate 2 was placed on the susceptor 50 and housed in the chamber 10 together with the susceptor 50. In the susceptor 50, a diameter was 230 mm, a thickness of the main body was 3 mm, and a radial width of the frame was 10 mm. Also, the inside of the chamber 11 was vacuumed. A vacuuming speed was 3 kPa/sec.

Next, a SiC epitaxial layer 3 having a thickness of 11 μm was formed on the SiC substrate 2. The rotational speed of the SiC substrate 2 during the formation of the SiC epitaxial layer 3 was 100 rpm. The carrier gas was Ar.

A ratio of the area of the part belonging to the carrier gas supply port (first gas supply port) to the top plate of the chamber: 1.5%

A ratio of the area of the carrier gas supply ports (the first gas supply ports) to all gas supply ports: 30%

A flow rate of the carrier gas was 1000 sccm or more and 4000 sccm or less.

In the SiC epitaxial wafer of the SiC epitaxial wafer of inventive example 3 produced under the above conditions, the variation in the carrier concentration and the variation in film thickness were measured in the same manner as in Inventive example 1. Furthermore, the variation in the carrier concentration in the first region and the variation in the film thickness in the first region were measured in the same manner as in Inventive example 1.

The LTV, the SFQR, the SORI, the warp, and the bow of the SiC epitaxial wafer of inventive example 3 were obtained by the same manner as in Inventive example 2.

The triangular defect density of the SiC epitaxial wafer of inventive example 3 was 0.12 pieces/cm$^2$. Moreover, the variation in the carrier concentration of the SiC epitaxial wafer of inventive example 3 was 157.3%. Moreover, the variation in the carrier concentration in the first region of the SiC epitaxial wafer of inventive example 3 was 107.6%. Moreover, the variation in the film thickness of the SiC epitaxial layer of the SiC epitaxial wafer of inventive example 3 was 18.1%. Moreover, the variation in the film thickness of the epitaxial layer in the first region of the SiC epitaxial wafer of inventive example 3 was 2.2%. Moreover, when the SiC epitaxial layer was divided into a plurality of regions each having a side length of 5 mm, the proportion of the region without triangular defects was 98% or more.

The LTV of the SiC epitaxial wafer of inventive example 3 was 2.8 μm. The SFQR of the SiC epitaxial wafer of inventive example 3 was 3.0 μm. The SORI of the SiC epitaxial wafer of inventive example 3 was 29.6 μm. The warp of the SiC epitaxial wafer of inventive example 3 was 40.2 μm. The bow of the SiC epitaxial wafer of inventive example 3 was −4.2 μm.

Inventive Example 4

First, a 4H-SiC substrate having a diameter of 200 mm and a thickness of 370 m was provided and housed inside a vertical furnace as shown in FIG. 9. The SiC substrate 2 was placed on the susceptor 50 and housed in the chamber 10 together with the susceptor 50. In the susceptor 50, a diameter was 230 mm, a thickness of the main body was 3 mm, and a radial width of the frame was 10 mm. Also, the inside of the chamber 11 was vacuumed. A vacuuming speed was 3 kPa/sec.

Next, a SiC epitaxial layer 3 having a thickness of 11 μm was formed on the SiC substrate 2. The rotational speed of the SiC substrate 2 during the formation of the SiC epitaxial layer 3 was 100 rpm. The carrier gas was Ar.

A ratio of the area of the part belonging to the carrier gas supply port (first gas supply port) to the top plate of the chamber: 2.25%

A ratio of the area of the carrier gas supply ports (the first gas supply ports) to all gas supply ports: 20%

A flow rate of the carrier gas was 1000 sccm or more and 4000 sccm or less.

In the SiC epitaxial wafer of the SiC epitaxial wafer of inventive example 4 produced under the above conditions, the variation in the carrier concentration and the variation in film thickness were measured in the same manner as in Inventive example 1. Furthermore, the variation in the carrier concentration in the first region and the variation in the film thickness in the first region were measured in the same manner as in Inventive example 1.

The LTV, the SFQR, the SORI, the warp, and the bow of the SiC epitaxial wafer of inventive example 4 were obtained by the same manner as in Inventive example 2.

The triangular defect density of the SiC epitaxial wafer of inventive example 4 was 0.20 pieces/cm². Moreover, the variation in the carrier concentration of the SiC epitaxial wafer of inventive example 4 was 16.3%. Moreover, the variation in the carrier concentration in the first region of the SiC epitaxial wafer of inventive example 4 was 6.7%. Moreover, the variation in the film thickness of the SiC epitaxial layer of the SiC epitaxial wafer of inventive example 4 was 4.4%. Moreover, the variation in the film thickness of the epitaxial layer in the first region of the SiC epitaxial wafer of inventive example 4 was 2.7%. Moreover, when the SiC epitaxial layer was divided into a plurality of regions each having a side length of 5 mm, the proportion of the region without triangular defects was 98% or more.

The LTV of the SiC epitaxial wafer of inventive example 4 was 1.9 μm. The SFQR of the SiC epitaxial wafer of inventive example 4 was 1.1 μm. The SORI of the SiC epitaxial wafer of inventive example 4 was 15.7 μm. The warp of the SiC epitaxial wafer of inventive example 4 was 15.6 μm. The bow of the SiC epitaxial wafer of inventive example 4 was −4.4 μm.

Inventive Example 5

First, a 4H-SiC substrate having a diameter of 200 mm and a thickness of 369 m was provided and housed inside a vertical furnace as shown in FIG. 9. The SiC substrate 2 was placed on the susceptor 50 and housed in the chamber 10 together with the susceptor 50. In the susceptor 50, a diameter was 230 mm, a thickness of the main body was 3 mm, and a radial width of the frame was 10 mm. Also, the inside of the chamber 11 was vacuumed. A vacuuming speed was 3 kPa/sec.

Next, a SiC epitaxial layer 3 having a thickness of 11 μm was formed on the SiC substrate 2. The rotational speed of the SiC substrate 2 during the formation of the SiC epitaxial layer 3 was 100 rpm. The carrier gas was Ar.

A ratio of the area of the part belonging to the carrier gas supply port (first gas supply port) to the top plate of the chamber: 2.25%

A ratio of the area of the carrier gas supply ports (the first gas supply ports) to all gas supply ports: 30%

A flow rate of the carrier gas was 1000 sccm or more and 4000 sccm or less.

In the SiC epitaxial wafer of the SiC epitaxial wafer of inventive example 5 produced under the above conditions, the variation in the carrier concentration and the variation in film thickness were measured in the same manner as in Inventive example 1. Furthermore, the variation in the carrier concentration in the first region and the variation in the film thickness in the first region were measured in the same manner as in Inventive example 1.

The LTV, the SFQR, the SORI, the warp, and the bow of the SiC epitaxial wafer of inventive example 5 were obtained by the same manner as in Inventive example 2.

The triangular defect density of the SiC epitaxial wafer of inventive example 5 was 0.05 pieces/cm². Moreover, the variation in the carrier concentration of the SiC epitaxial wafer of inventive example 5 was 23.9%. Moreover, the variation in the carrier concentration in the first region of the SiC epitaxial wafer of inventive example 5 was 23.8%. Moreover, the variation in the film thickness of the SiC epitaxial layer of the SiC epitaxial wafer of inventive example 5 was 4.9%. Moreover, the variation in the film thickness of the epitaxial layer in the first region of the SiC epitaxial wafer of inventive example 5 was 3.2%. Moreover, when the SiC epitaxial layer was divided into a plurality of regions each having a side length of 5 mm, the proportion of the region without triangular defects was 98% or more.

The LTV of the SiC epitaxial wafer of inventive example 5 was 1.8 μm. The SFQR of the SiC epitaxial wafer of inventive example 5 was 1.1 μm. The SORI of the SiC epitaxial wafer of inventive example 5 was 23.6 μm. The warp of the SiC epitaxial wafer of inventive example 5 was 29.1 μm. The bow of the SiC epitaxial wafer of inventive example 5 was −5.8 μm.

Inventive Example 6

First, a 4H-SiC substrate having a diameter of 200 mm and a thickness of 376 m was provided and housed inside a vertical furnace as shown in FIG. 9. The SiC substrate 2 was placed on the susceptor 50 and housed in the chamber 10 together with the susceptor 50. In the susceptor 50, a diameter was 230 mm, a thickness of the main body was 3 mm, and a radial width of the frame was 10 mm. Also, the inside of the chamber 11 was vacuumed. A vacuuming speed was 3 kPa/sec.

Next, a SiC epitaxial layer 3 having a thickness of 11 μm was formed on the SiC substrate 2. The rotational speed of the SiC substrate 2 during the formation of the SiC epitaxial layer 3 was 100 rpm. The carrier gas was Ar.

A ratio of the area of the part belonging to the carrier gas supply port (first gas supply port) to the top plate of the chamber: 2.5%

A ratio of the area of the carrier gas supply ports (the first gas supply ports) to all gas supply ports: 30%

A flow rate of the carrier gas was 1000 sccm or more and 4000 sccm or less.

In the SiC epitaxial wafer of the SiC epitaxial wafer of inventive example 6 produced under the above conditions, the variation in the carrier concentration and the variation in film thickness were measured in the same manner as in Inventive example 1. Furthermore, the variation in the carrier concentration in the first region and the variation in the film thickness in the first region were measured in the same manner as in Inventive example 1.

The LTV, the SFQR, the SORI, the warp, and the bow of the SiC epitaxial wafer of inventive example 6 were obtained by the same manner as in Inventive example 2.

The triangular defect density of the SiC epitaxial wafer of inventive example 6 was 0.02 pieces/cm². Moreover, the variation in the carrier concentration of the SiC epitaxial wafer of inventive example 6 was 9.8%. Moreover, the variation in the carrier concentration in the first region of the SiC epitaxial wafer of inventive example 6 was 7.5%. Moreover, the variation in the film thickness of the SiC epitaxial layer of the SiC epitaxial wafer of inventive example 6 was 4.9%. Moreover, the variation in the film thickness of the epitaxial layer in the first region of the SiC epitaxial wafer of inventive example 6 was 2.0%. Moreover, when the SiC epitaxial layer was divided into a plurality of regions each having a side length of 5 mm, the proportion of the region without triangular defects was 98% or more.

The LTV of the SiC epitaxial wafer of inventive example 6 was 1.9 μm. The SFQR of the SiC epitaxial wafer of inventive example 6 was 2.0 μm. The SORI of the SiC epitaxial wafer of inventive example 6 was 13.1 μm. The warp of the SiC epitaxial wafer of inventive example 6 was 15.2 μm. The bow of the SiC epitaxial wafer of inventive example 6 was −4.9 μm.

Inventive Example 7

First, a 4H-SiC substrate having a diameter of 200 mm and a thickness of 380 m was provided and housed inside a vertical furnace as shown in FIG. 9. The SiC substrate 2 was placed on the susceptor 50 and housed in the chamber 10 together with the susceptor 50. In the susceptor 50, a diameter was 230 mm, a thickness of the main body was 3 mm, and a radial width of the frame was 10 mm. Also, the inside of the chamber 11 was vacuumed. A vacuuming speed was 3 kPa/sec.

Next, a SiC epitaxial layer 3 having a thickness of 11 μm was formed on the SiC substrate 2. The rotational speed of the SiC substrate 2 during the formation of the SiC epitaxial layer 3 was 100 rpm. The carrier gas was Ar.

A ratio of the area of the part belonging to the carrier gas supply port (first gas supply port) to the top plate of the chamber: 2.5%

A ratio of the area of the carrier gas supply ports (the first gas supply ports) to all gas supply ports: 20%

A flow rate of the carrier gas was 1000 sccm or more and 4000 sccm or less.

In the SiC epitaxial wafer of the SiC epitaxial wafer of inventive example 7 produced under the above conditions, the variation in the carrier concentration and the variation in film thickness were measured in the same manner as in Inventive example 1. Furthermore, the variation in the carrier concentration in the first region and the variation in the film thickness in the first region were measured in the same manner as in Inventive example 1.

The LTV, the SFQR, the SORI, the warp, and the bow of the SiC epitaxial wafer of inventive example 7 were obtained by the same manner as in Inventive example 2.

The triangular defect density of the SiC epitaxial wafer of inventive example 7 was 0.003 pieces/cm². Moreover, the variation in the carrier concentration of the SiC epitaxial wafer of inventive example 7 was 34.2%. Moreover, the variation in the carrier concentration in the first region of the SiC epitaxial wafer of inventive example 7 was 32.9%. Moreover, the variation in the film thickness of the SiC epitaxial layer of the SiC epitaxial wafer of inventive example 7 was 5.3%. Moreover, the variation in the film thickness of the epitaxial layer in the first region of the SiC epitaxial wafer of inventive example 7 was 3.8%. Moreover, when the SiC epitaxial layer was divided into a plurality of regions each having a side length of 5 mm, the proportion of the region without triangular defects was 98% or more.

The LTV of the SiC epitaxial wafer of inventive example 7 was 2.3 μm. The SFQR of the SiC epitaxial wafer of inventive example 7 was 1.1 μm. The SORI of the SiC epitaxial wafer of inventive example 7 was 3.2 μm. The warp of the SiC epitaxial wafer of inventive example 7 was 3.3 μm. The bow of the SiC epitaxial wafer of inventive example 7 was 1.6 μm.

Comparative Example 1

Unlike inventive example 1, comparative example 1 used a susceptor having a diameter of 250 mm, a thickness of 8 mm of the main body, and a radial width of the frame of 20 mm, and the area ratio to which the carrier gas belonged to the top plate of the chamber was 42%, and the area ratio of the carrier gas supply ports to all gas supply ports was 71%, the flow rate of the carrier gas was less than 1000 sccm, the vacuuming speed was 6 kPa/sec, and the rotational speed of the SiC substrate 2 during the formation of the SiC epitaxial layer 3 was 300 rpm.

Other conditions were the same as those of inventive example 1 and the triangular defect density, the variation in the carrier concentration, and the variation in film thickness in the SiC epitaxial wafer of comparative example 1 were measured.

The triangular defect density of the SiC epitaxial wafer of comparative example 1 was 0.24 pieces/cm². Moreover, the variation in the carrier concentration of the SiC epitaxial wafer of comparative example 1 was 26.1%. Moreover, the variation in the carrier concentration in the first region of the SiC epitaxial wafer of comparative example 1 was 25.9%. Moreover, the variation in the film thickness of the SiC epitaxial layer of the SiC epitaxial wafer of comparative example 1 was 5.3%. Moreover, the variation in the film thickness of the epitaxial layer in the first region of the SiC epitaxial wafer of comparative example 1 was 5.3%. Moreover, when the SiC epitaxial layer was divided into a plurality of regions each having a side length of 5 mm, the proportion of the region without triangular defects was less than 98%.

EXPLANATION OF REFERENCES

1 SiC epitaxial wafer
2 SiC substrate
3 SiC epitaxial layer
4 Notch
5 Triangular defect
6 Starting point
10 Chamber

11 Main body
12 Gas supply port
13 Gas exhaust port
20 Support
30 Lower heater
40 Upper Heater
50 Susceptor
51 Main body
52 Frame
A Unit exposure region

What is claimed is:

1. A SiC epitaxial wafer comprising:

a SiC substrate; and a SiC epitaxial layer, wherein the SiC substrate has a diameter of 195 mm or more and a thickness of 460 μm or less, and wherein the SiC epitaxial layer has a triangular defect density of 0.2 pieces/cm² or less.

2. The SiC epitaxial wafer according to claim 1, wherein a local thickness variation (LTV) in each of a plurality of unit exposure regions classified as 20 mm squares is 4 μm or less in a planar view in a stacking direction of the SiC epitaxial wafer.

3. The SiC epitaxial wafer according to claim 1, wherein site flatness (site flatness, front reference surface, least-squares best-fit reference plane, range (SFQR)) in each of a plurality of unit exposure regions classified as 20 mm squares is 2 μm or less in a planar view in a stacking direction of the SiC epitaxial wafer.

4. The SiC epitaxial wafer according to claim 1, wherein warp is 90 μm or less.

5. The SiC epitaxial wafer according to claim 1, wherein bow is 60 μm or less when a surface connecting a support point overlapping a circumference within 7.5 mm from an outermost circumference and an overlapping portion as seen in a thickness direction is used as a reference surface.

6. The SiC epitaxial wafer according to claim 1, wherein SORI is 60 μm or less.

7. The SiC epitaxial wafer according to claim 1, wherein the SiC epitaxial layer can be divided into a plurality of regions each having a 5 mm square in a planar view in a stacking direction of the SiC epitaxial wafer, and wherein a proportion of regions not having any triangular defect among the plurality of regions is 98% or more.

8. The SiC epitaxial wafer according to claim 1, wherein the SiC epitaxial layer has a carrier concentration variation of 20% or less.

9. The SiC epitaxial wafer according to claim 1, wherein a variation in a film thickness of the SiC epitaxial layer is 5% or less.

* * * * *